(12) United States Patent
Huang

(10) Patent No.: US 8,498,167 B1
(45) Date of Patent: Jul. 30, 2013

(54) TEMPERATURE-DEPENDENT SELF-REFRESH TIMING CIRCUIT FOR SEMICONDUCTOR MEMORY DEVICE

(75) Inventor: Ming-Chien Huang, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 79 days.

(21) Appl. No.: 13/355,136

(22) Filed: Jan. 20, 2012

(51) Int. Cl.
*G11C 7/06* (2006.01)

(52) U.S. Cl.
USPC .................................. 365/189.07

(58) Field of Classification Search
USPC .................................. 365/189.07
See application file for complete search history.

(56) References Cited

U.S. PATENT DOCUMENTS

| | | | | |
|---|---|---|---|---|
| 7,177,220 B2* | 2/2007 | Chou et al. | ..................... | 365/222 |
| 7,286,432 B2* | 10/2007 | Heilmann et al. | ............ | 365/211 |
| 7,486,583 B2* | 2/2009 | Lee | ............................... | 365/222 |
| 7,701,796 B2* | 4/2010 | Kim | ............................... | 365/222 |

\* cited by examiner

*Primary Examiner* — Huan Hoang
*Assistant Examiner* — Tri Hoang
(74) *Attorney, Agent, or Firm* — Stites & Harbison PLLC; Juan Carlos A. Marquez, Esq.

(57) ABSTRACT

A semiconductor memory device with a self-refresh timing circuit is provided. The semiconductor memory device comprises a plurality of memory banks, a command decoder, a bank address generator, a self-refresh counter, and the self-refresh timing circuit. The self-refresh timing circuit comprises a temperature sensor, a reference voltage source, a comparison circuit, an enable circuit, and an oscillation circuit. The comparison circuit compares a voltage from the temperature sensor with a constant voltage from the reference voltage source and generates a comparison signal. The enable circuit activates the comparison circuit when self-refresh operations for at least one refresh row are completed in all memory cell banks. The oscillation circuit generates a self-refresh clock signal which controls the operating frequency of the bank address generator and the self-refresh counter.

10 Claims, 7 Drawing Sheets

16

TEMPERATURE-DEPENDENT SELF-REFRESH TIMING CIRCUIT FOR SEMICONDUCTOR MEMORY DEVICE

BACKGROUND OF THE INVENTION

1. Field of the Invention

The present invention relates to a temperature-dependent self-refresh timing circuit for a semiconductor memory device.

2. Description of the Related Art

Semiconductor memory devices are widely used in many electronic products and computer systems to store and retrieve data. A semiconductor memory device comprises a large number of memory cells, each of which is constructed of one transistor and one capacitor. A DRAM memory device achieves storage of data by storing charges in capacitors. Because a charge stored in a capacitor slowly leaks over time, the memory cells of the DRAM memory device need to be periodically refreshed or updated to a full value.

Several schemes have been developed to periodically refresh memory cells in a DRAM memory device, one of which is a self-refresh scheme. The self-refresh is a mode in which a memory cell corresponding to an address generated by an internal address counter performs a refresh operation in a predetermined period when a self-refresh command is input. The predetermined period is typically determined according to a data maintenance time in the DRAM cell. After the refresh operation, the address counter is re-initialized and is provided for the next self-refresh command.

Typically, the self-refresh mode is set in a low power consumption mode and a current consumption in the self-refresh mode is required to be as low as possible. One way to reduce power consumption required for the self-refresh in the DRAM memory device is to change the predetermined refresh period in response to the ambient temperature. That is, the refresh operation may be performed in a longer predetermined period when the temperature is less than a desired value, while alternatively the refresh operation may be performed in a shorter predetermined period when the temperature is larger than the desired value.

In order to sense the ambient temperature, a temperature sensor is placed in a DRAM device to provide a corresponding temperature signal, and the predetermined period is varied in response to the temperature signal. However, in the conventional art, the temperature sensor is always activated to detect the temperature, thereby increasing the total power consumption of the DRAM memory device. In order to reduce the power consumption, there is a need to provide a timing circuit to control the predetermined period of time and to provide an enable circuit to selectively activate the timing circuit.

SUMMARY OF THE INVENTION

One aspect of the present invention is to provide a semiconductor memory device with a self-refresh timing circuit.

According to one embodiment of the present invention, the semiconductor memory device comprises a plurality of memory banks, a command decoder, a bank address generator, a self-refresh counter, and the self-refresh timing circuit. The command decoder receives an external command and generates a self-refresh control signal, wherein the memory device performs self-refresh operations in response to the self-refresh control signal. The bank address generator generates a target bank address to each of the memory banks to perform the self-refresh operation on the target bank. The self-refresh counter specifies a target refresh row to all memory banks. The self-refresh timing circuit comprises a temperature sensor, a reference voltage source, a comparison circuit, an enable circuit, and an oscillation circuit. The temperature sensor generates a voltage in response to a sensed temperature. The reference voltage source generates a constant voltage. The comparison circuit compares the voltage from the temperature sensor with the constant voltage and generates a comparison signal. The enable circuit generates an enable signal to activate the comparison circuit. The oscillation circuit generates a self-refresh clock signal in response to the comparison signal and the enable signal, wherein the self-refresh clock signal controls the operating frequency of the bank address generator and the self-refresh counter. The enable signal is generated when self-refresh operations for at least one refresh row are completed in all memory cell banks.

According to another embodiment of the present invention, the semiconductor memory device comprises a plurality of memory banks, a command decoder, a bank address generator, a self-refresh counter, and the self-refresh timing circuit. The command decoder receives an external command and generates a self-refresh control signal, wherein the memory device performs self-refresh operations in response to the self-refresh control signal. The bank address generator generates a target bank address to each of the memory banks to perform the self-refresh operation on the target bank. The self-refresh counter specifies a target refresh row to all memory banks. The self-refresh timing circuit comprises a temperature sensor, a reference voltage source, a comparison circuit, an enable timing circuit, and an oscillation circuit. The temperature sensor generates a voltage in response to a sensed temperature. The reference voltage source generates a constant voltage. The comparison circuit compares the voltage from the temperature sensor with the constant voltage and generates a comparison signal. The enable timing circuit generates an enable signal to activate the comparison circuit at fixed time intervals. The oscillation circuit generates a self-refresh clock signal in response to the comparison signal and the enable signal, wherein the self-refresh clock signal controls the operating frequency of the bank address generator and the self-refresh counter.

BRIEF DESCRIPTION OF THE DRAWINGS

The invention will be described according to the appended drawings in which.

DETAILED DESCRIPTION OF THE INVENTION

Figure 1:
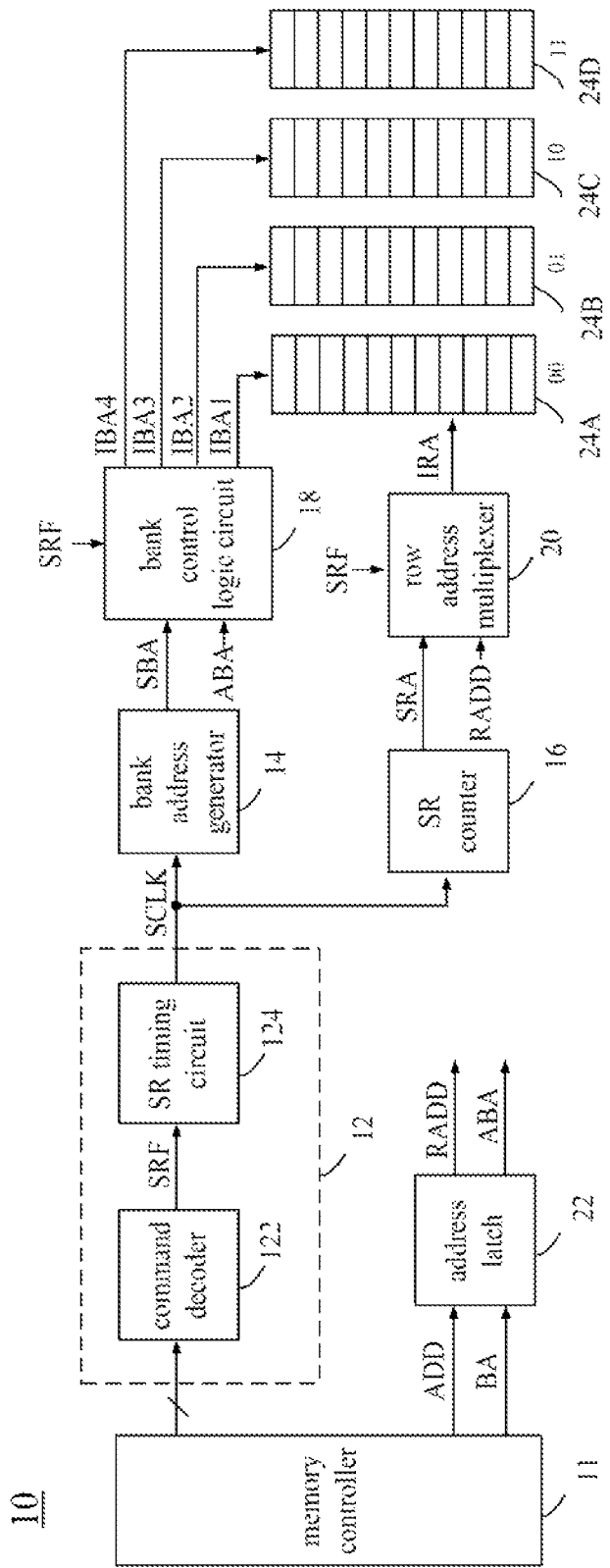
FIG. 1 is a functional block diagram of a semiconductor memory device including a self-refresh controller for adjusting the refresh period of the memory device according to one embodiment of the present invention.

FIG. 1 is a functional block diagram of a semiconductor memory device 10 including a self-refresh controller 12 for adjusting the refresh period of the memory device 10 according to one embodiment of the present invention. The self-refresh controller 12 adjusts a refresh frequency of a refresh clock signal SCLK which controls the operating frequency of the refresh counter.

Referring to FIG. 1, the semiconductor memory device 10 includes a plurality of memory banks 24, and each memory bank has a plurality of memory cells arranged in columns and rows. In the specification, for the sake of convenience in explanation, the semiconductor memory device 10 having four memory banks 24A-24D will be described by way of example. It is noted that the invention is equally applicable to memory devices having a plurality of memory banks other than four in number.

Referring to FIG. 1, the self-refresh controller 12 includes a command decoder 122 and a self-refresh (SR) timing circuit 124. The command decoder 122 receives a plurality of external command and clocking signals from a memory controller 11 and generates a plurality of control and timing signals to control the components 12-24 during operation of the memory device 10. For example, when a self-refresh command is received from the memory controller 11, the command decoder 122 asserts a self-refresh control signal SRF, and the memory device 10 performs a self-refresh operation in response to the self-refresh control signal SRF.

Referring to FIG. 1, upon receiving the self-refresh control signal SRF, the SR timing circuit 124 generates the refresh clock signal SCLK to control both a bank address generator 14 and a self-refresh (SR) counter 16.

The SR counter 16 is used to generate a target row address for the row that is to be refreshed. The bank address generator 14 is used to generate a target bank address for the specific bank containing the row that is to be refreshed.

Referring to FIG. 1, an address latch 22 receives a plurality of external addresses ADD and a plurality of external bank addresses BA from the memory controller 11, and generates a row address RADD to a row address multiplexer 20 and a bank address ABA to a bank control logic circuit 18, respectively. The row address multiplexer 20, activated by the self-refresh control signal SRF generated from the command decoder 122, receives the row address RADD during operation in a normal mode and receives a self-refresh row address SRA during operation in the self-refresh mode, and, in turn, generates an internal row address IRA.

The bank control logic circuit 18, activated by the self-refresh control signal SRF generated from the command decoder 122, receives the bank address ABA and a self-refresh bank address SBA. When the control signal SRF is deactivated, the bank address ABA is passed through the circuit 18 as an internal bank address IBA. When the control signal SREF is activated, to the self-refresh bank address SBA is passed through the circuit 18 as the internal bank address IBA.

Figure 2:
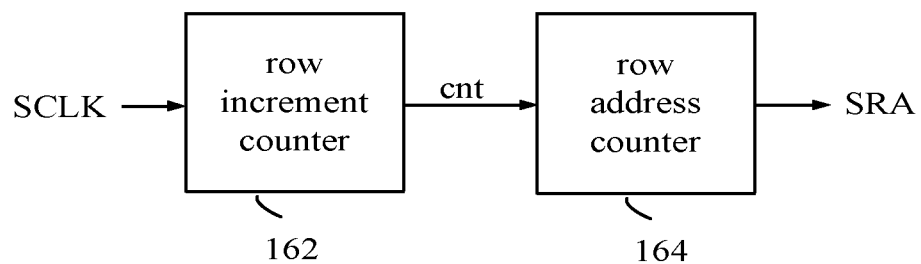
FIG. 2 is a detailed circuit diagram of the SR counter shown in FIG. 1.

FIG. 2 is a detailed circuit diagram of the SR counter 16 shown in FIG. 1. Referring to FIG. 2, the SR counter 16 includes a row increment counter 162 and a row address counter 164. The row increment counter 162 is used to increment the row address counter 164 during operation in the self-refresh mode. The row address counter 164 contains the target row address for a row that is to be refreshed. The row address counter 164 points to the same row in all the banks 24A-24D.

Figure 3:
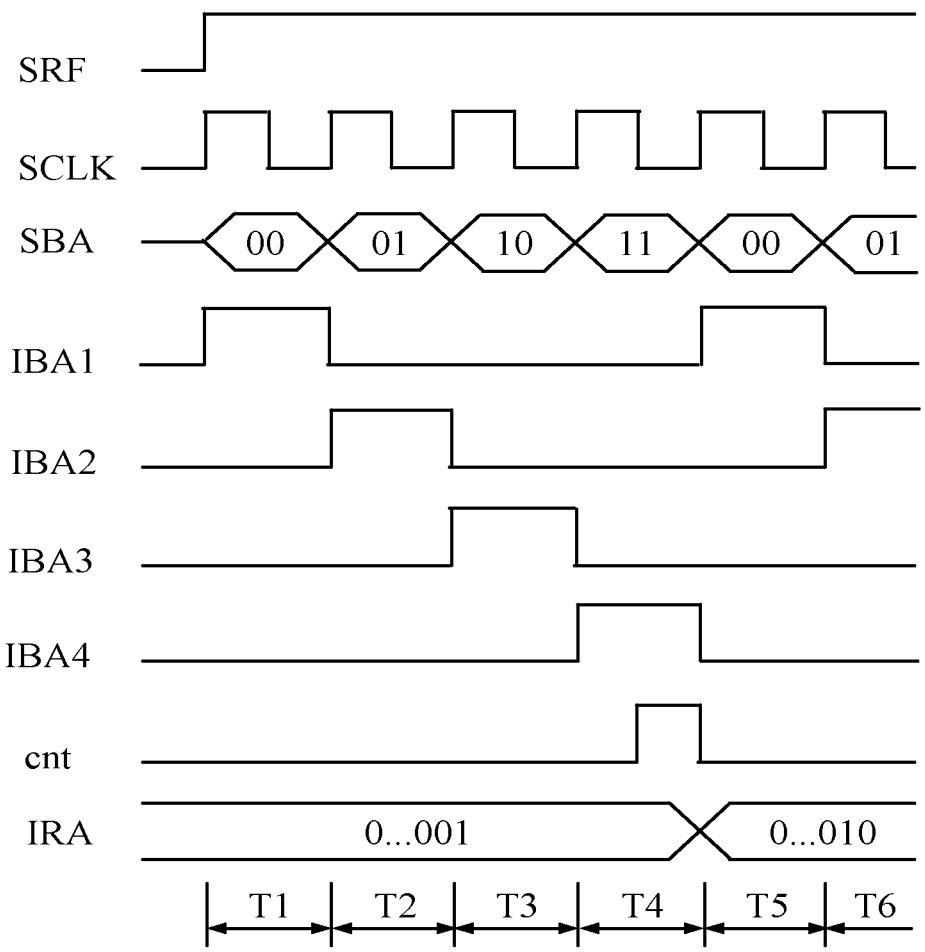
FIG. 3 shows a timing diagram illustrating the operation of the memory device with the self-refresh controller with respect to FIG. 1 and FIG. 2.

FIG. 3 shows a timing diagram illustrating the operation of the memory device 10 with the self-refresh controller 12 with respect to FIG. 1 and FIG. 2, assuming four memory banks 24A-24D with bank addresses 00, 01, 10, and 11. Referring to FIG. 3, upon receiving a self-refresh command from the memory controller 11, the command decoder 122 generates a self-refresh control signal SRF with a logic high level at the beginning of interval T1, and the memory device 10 performs a self-refresh operation in response to the signal SRF. The SR timing circuit 124 generates a first SCLK pulse to both bank address generator 14 and SR counter 16 in response to the signal SRF. When the memory device 10 performs the self-refresh operation, a target row address SRA generated from the SR counter 16 and a target bank address SBA generated from the bank address generator 14 are used to refresh a specific row in an identified bank. In this example, a current refresh row address SRA with a value 0 . . . 001 is stored in the row address counter 16 and a first self-refresh bank address SBA with a value 00 is stored in the bank address generator 14. Therefore, during interval T1, bank 24A is selected as the target bank and row 0 . . . 001 in bank 24A is refreshed.

Subsequently, a second refresh bank address SBA with a value 01, a third refresh bank address SBA with a value 10, and a fourth refresh bank address SBA with a value 11 are latched sequentially at the rising edge of the second, the third, and the fourth pulse of the signal SCLK. As a result, bank 24B, bank 24C, and bank 24D are selected as the target bank in a sequential manner and the same row (row 0 . . . 001) in different target banks 24B, 24C, and 24D are refreshed in successive SCLK cycles between time interval T2 and T4.

After four SCLK pulses, the row 0 . . . 001 has finally been refreshed in all banks. Therefore, the row increment counter 162 generates a count signal cnt to the row address counter 164. The count signal cnt, in turn, increments the row address counter 164 thereby moving the current refresh row address to a new row for refresh. In one embodiment of the present invention, the initial value stored in the row increment counter 162 is assumed to be zero (0) and the row increment counter 162 is incremented to a value of one (1) at the end of interval T4. As a result, the row address counter 164 updates the current refresh row address SRA with a value 0 . . . 001 to the next refresh row address SRA with a value 0 . . . 010. Through similar responses, the new row 0 . . . 010 is refreshed in all banks in successive SCLK cycles.

Figure 4:
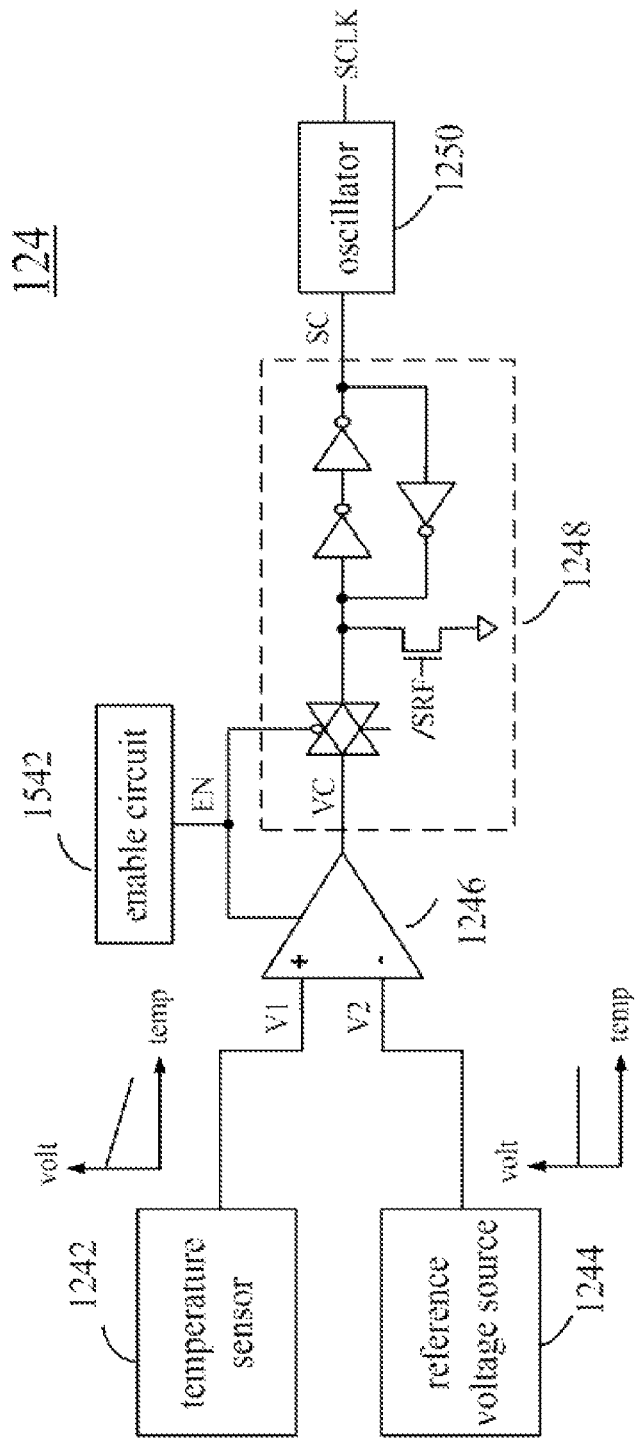
FIG. 4 is a circuit diagram of the SR timing circuit for generating a temperature-dependent refresh clock signal according to one embodiment of the present invention.

In order to reduce power consumption required for the self-refresh operation of the memory device 10, the refresh frequency of the refresh clock signal SCLK can be changed in response to different temperature. FIG. 4 is a circuit diagram of the SR timing circuit 124 for generating a temperature-dependent refresh clock signal SCLK according to one embodiment of the present invention. Referring to FIG. 4, the SR timing circuit 124 includes a temperature sensor 1242, a reference voltage source 1244, a comparator 1246, a logic circuit 1248, and an oscillator 1250. The temperature sensor 1242 is placed in proximity to the memory cells and is used to output a voltage V1 that is proportional to a sensed temperature. The reference voltage source 1244 generates a constant voltage V2 regardless of changes in the sensed temperature. The comparator 1246 compares the voltage V1 with the voltage V2, and generates a signal VC in response to a comparison result and an enable signal EN. The logic circuit 1248 generates a signal SC in response to the self-refresh control signal SRF and the enable signal EN. The oscillator 1250 generates the refresh clock signal SCLK oscillating at a predetermined frequency in response to a logic level of the signal SC.

The operation of the SR timing circuit 124 having the foregoing configuration is described below.

When the temperature sensed by the temperature sensor 1242 is lower than a predetermined temperature, the value of the voltage V2 is larger than that of the voltage V1. Upon receiving the enable signal EN, the comparator 1246 outputs the comparison signal VC at a logic low level. The logic circuit 1248 sends the signal SC at the logic low level when the signals EN and SRF are both activated to a logic high level. Upon receiving the signal SC having the logic low level, the oscillator 1250 generates the oscillation signal SCLK oscillating at a lower frequency, thereby reducing the operating frequency of the bank address generator 14 and the SR counter 16.

Figure 5:
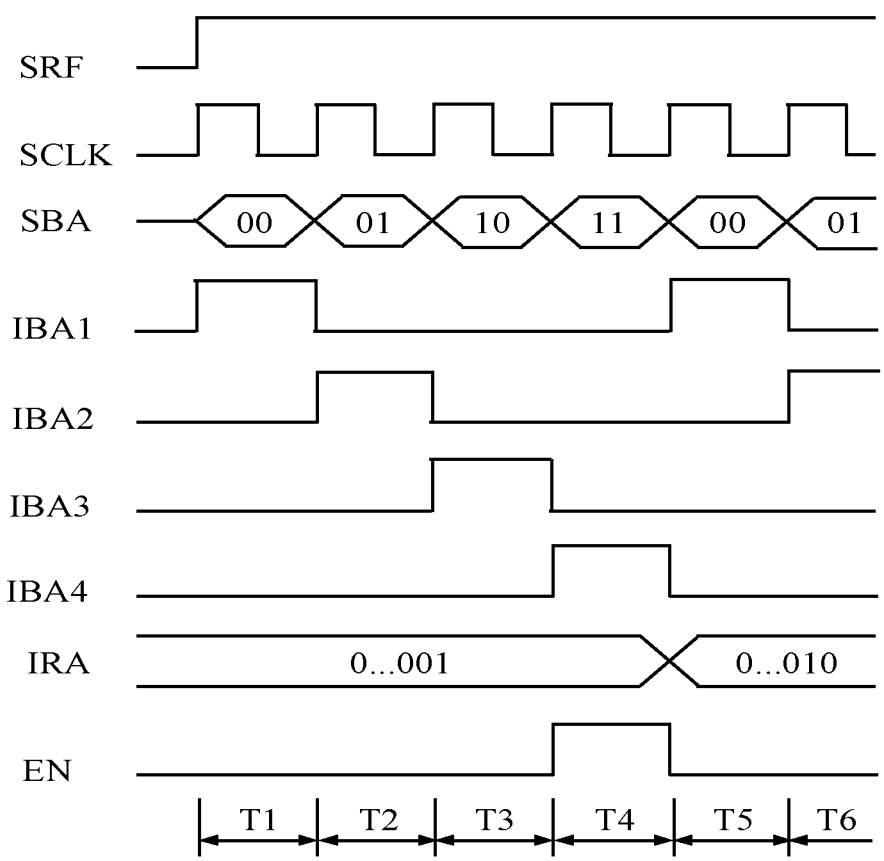
FIG. 5 shows a timing diagram of the enable signal according to one embodiment of the present invention.

Referring to FIG. 4, the comparator 1246 and the logic circuit 1248 are activated by the enable signal EN generated from an enable circuit 1542. In particular, the comparator 1246 and the logic circuit 1248 are activated only when the enable circuit 1542 sends the enable signal EN at a logic high level. The enable signal EN with the logic high level is generated when self-refresh operations for at least one refresh row are completed in all memory cell banks. FIG. 5 shows a timing diagram of the enable signal EN according to one embodiment of the present invention. Referring to FIG. 5, when the refresh row address SRA with a value 0 . . . 001 is selected and the row 0 . . . 001 in all four banks 24A, 24B, 24C, and 24D are refreshed during successive SCLK cycles, the enable signal EN transits from the logic low level to the logic high level, which activates the comparator 1246 and the logic circuit 1248. The comparator 1246 and the logic circuit 1248 are then turned on after a short delay. In this example, since the comparator 1246 is only turned on at the fourth SCLK pulse, the power consumption of the semiconductor memory device 10 can be lessened.

In order to further reduce power consumption of the memory device 10, the comparator 1246 and the logic circuit 1248 may be turned on when two or more specific rows in all four banks 24A, 24B, 24C, and 24D are refreshed. In one embodiment of the present invention, the row address counter 164 updates the current refresh row address SRA with a value 0 . . . 001 to the next refresh row address SRA with a value 0 . . . 010 when the self-refresh operations for the refresh row 0 . . . 001 are completed in all memory banks. The enable circuit 1542 then activates the comparator 1246 and the logic circuit 1248 when the self-refresh operations for the new row 0 . . . 010 are completed in all memory banks. In another embodiment of the present invention, the row address counter 164 updates the current refresh row address SRA in a sequential manner. If each bank of the memory banks 24A-24D has 512 rows, the enable circuit 1542 may activate the comparator 1246 and the logic circuit 1248 until all rows (512 rows in total) in all banks are refreshed.

Figure 6:
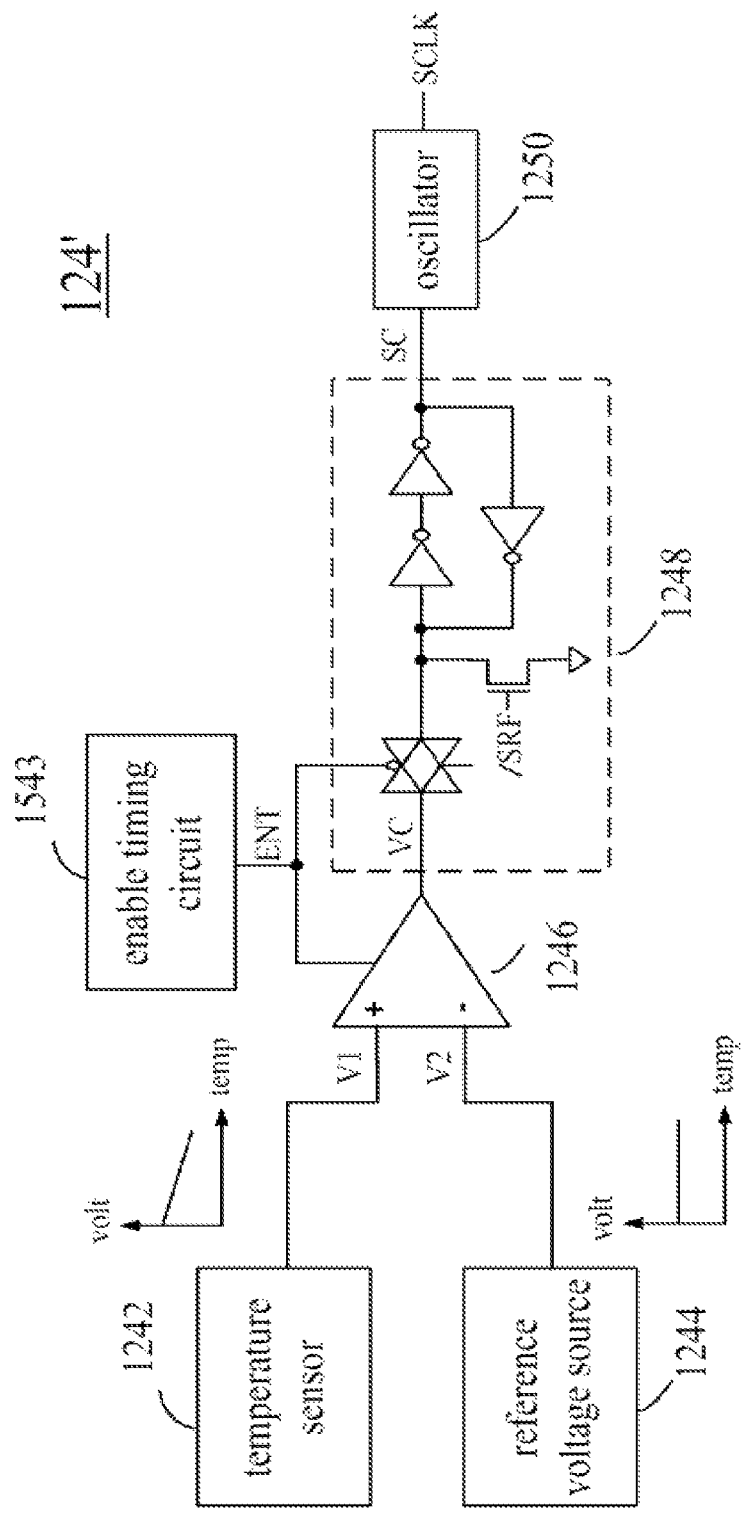
FIG. 6 is a circuit diagram of a SR timing circuit for generating a temperature-dependent refresh clock signal according to another embodiment of the present invention.

Another embodiment of the present invention provides an alternate method of reducing the power consumption required for the self-refresh operation of the memory device 10. In this embodiment, the enable circuit can be activated at fixed time intervals. FIG. 6 is a circuit diagram of a SR timing circuit 124' for generating a temperature-dependent refresh clock signal SCLK according to another embodiment of the present invention. The SR timing circuit 124' includes a temperature sensor 1242, a reference voltage source 1244, a comparator 1246, a logic circuit 1248, an oscillator 1250, and an enable timing circuit 1543. Referring to FIG. 6, components having similar functions to those in FIG. 4 are denoted by the same reference numerals and detailed descriptions thereof will be omitted.

Figure 7:
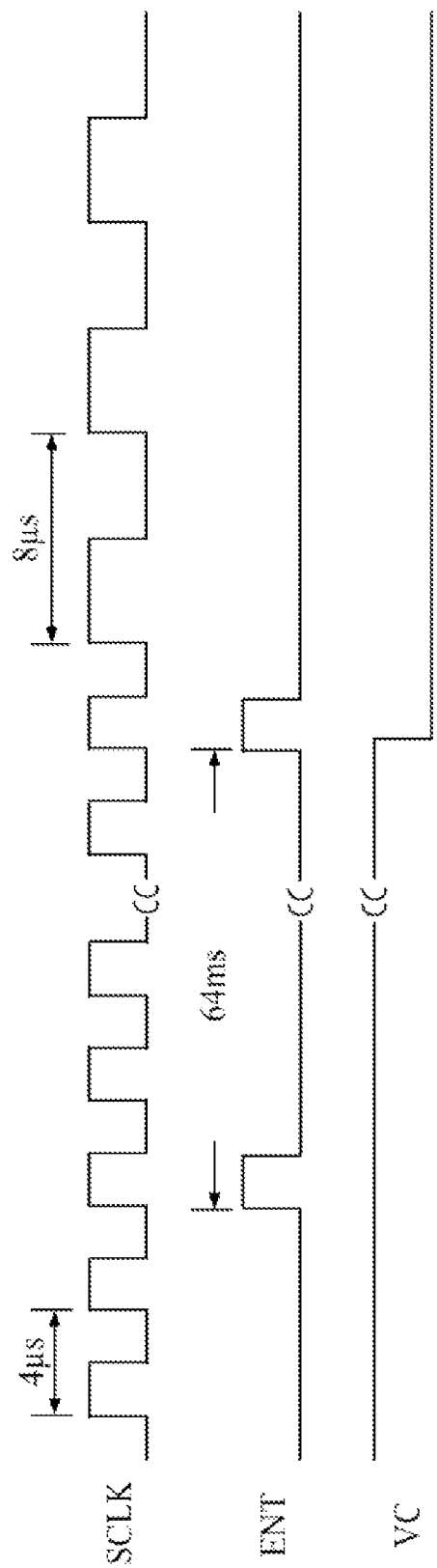
FIG. 7 shows a timing diagram illustrating the operation of the SR timing circuit with respect to FIG. 6.

FIG. 7 shows a timing diagram illustrating the operation of the SR timing circuit 124' with respect to FIG. 6. Referring to FIG. 6 and FIG. 7, the oscillator 1250 generates the oscillation signal SCLK with a fixed period of 4 µs at the beginning of the self-refresh operation. Therefore, the refresh operations are repeatedly performed during successive SCLK cycles. In this embodiment, the enable timing circuit 1543 generates an enable signal ENT whose periods are integer multiples of a period of the oscillation signal SCLK, i.e. about 64 ms. As such, the comparator 1246 and the logic circuit 1248 are activated every 64 ms.

Referring to FIG. 6 and FIG. 7, when the enable timing circuit 1543 first generates the enable signal ENT at a logic high level, the comparator 1246 is activated so as to output the comparison signal VC. Because the temperature sensed by the temperature sensor 1242 is higher than a predetermined temperature, the comparator 1246 outputs the comparison signal VC at a logic high level, causing the clock period of the signal SCLK to remain the same. After 64 ms passes, the enable timing circuit 1543 generates the enable signal ENT at a logic high level again, rendering the comparator 1246 and the logic circuit 1248 to be activated. Because the sensed ambient temperature is lower than the predetermined temperature this moment, the comparator 1246 outputs the comparison signal VC at a logic low level, causing the oscillator 1250 to generate the signal SCLK with a longer clock period, i.e. 8 µs in this case. Since the self-refresh operation is performed in a longer period, the current consumption in the semiconductor memory device 10 can be lessened.

The above-described embodiments of the present invention are intended to be illustrative only. Numerous alternative embodiments may be devised by those skilled in the art without departing from the scope of the following claims.

What is claimed is:

1. A semiconductor memory device comprising:
    a command decoder for receiving an external command to generate a self-refresh control signal, wherein the memory device performs self-refresh operations in response to the self-refresh control signal;
    a plurality of memory banks, each memory bank having a plurality of memory cells arranged in columns and rows;
    a bank address generator for generating a target bank address to each of the memory banks to perform the self-refresh operation on the target bank;
    a self-refresh counter for specifying a target refresh row to all memory banks; and
    a self-refresh timing circuit comprising:
        a temperature sensor for generating a voltage in response to a sensed temperature;
        a reference voltage source for generating a constant voltage;
        a comparison circuit for comparing the voltage from the temperature sensor with the constant voltage to generate a comparison signal;
        an enable circuit for generating an enable signal to activate the comparison circuit; and
        an oscillation circuit for generating a self-refresh clock signal in response to the comparison signal and the enable signal, wherein the self-refresh clock signal controls the operating frequency of the bank address generator and the self-refresh counter;
        wherein the enable signal is generated when self-refresh operations for at least one refresh row are completed in all memory cell banks.

2. The semiconductor memory device of claim 1, wherein the self-refresh counter further comprises a row address counter for providing the target row address to all memory banks and a row increment counter for controlling the row address counter.

3. The semiconductor memory device of claim 1, wherein the enable circuit activates the comparison circuit when the self-refresh operations for the target refresh row are completed in all memory banks.

4. The semiconductor memory device of claim 1, wherein the target refresh row is updated to a new row after the self-refresh operations for the target refresh row are completed in all memory banks, and the enable circuit activates the comparison circuit when the self-refresh operations for the new row are completed in all memory banks.

5. The semiconductor memory device of claim 1, wherein the current refresh row is updated in a sequential manner, and the logic circuit activates the comparison circuit when the self-refresh operations for the last row among the rows are completed in all memory cell banks.

6. The semiconductor memory device of claim 1, wherein when the sensed temperature is higher than a predetermined temperature, the oscillation circuit generates the self-refresh clock signal with a first frequency, when the sensed temperature is lower than the predetermined temperature, the oscillation circuit generates the self-refresh clock signal with a second frequency, wherein the value of the first frequency is larger than that of the second frequency.

7. A semiconductor memory device comprising:
   a command decoder for receiving an external command to generate a self-refresh control signal, wherein the memory device performs self-refresh operations in response to the self-refresh control signal;
   a plurality of memory banks, each memory bank having a plurality of memory cells arranged in columns and rows;
   a bank address generator for generating a target bank address to each of the memory banks to perform the self-refresh operation on the target bank;
   a self-refresh counter for specifying a target refresh row to all memory banks; and
   a self-refresh timing circuit comprising:
      a temperature sensor for generating a voltage in response to a sensed temperature;
      a reference voltage source for generating a constant voltage;
      a comparison circuit for comparing the voltage from the temperature sensor with the constant voltage to generate a comparison signal;
      an enable timing circuit for generating an enable signal to activate the comparison circuit at fixed time intervals; and
      an oscillation circuit for generating a self-refresh clock signal in response to the comparison signal and the enable signal, wherein the self-refresh clock signal controls the operating frequency of the bank address generator and the self-refresh counter.

8. The semiconductor memory device of claim 7, wherein the self-refresh counter further comprises a row address counter for providing the target row address to all memory banks and a row increment counter for controlling the row address counter.

9. The semiconductor memory device of claim 7, wherein when the sensed temperature is higher than a predetermined temperature, the oscillation circuit generates the self-refresh clock signal with a first period, when the sensed temperature is lower than the predetermined temperature, the oscillation circuit generates the self-refresh clock signal with a second period, wherein the first period is shorter than the second period.

10. The semiconductor memory device of claim 7, wherein the enable timing circuit activates the comparison circuit at integer multiples of the period of the self-refresh clock signal.

\* \* \* \* \*